United States Patent
Kim et al.

(10) Patent No.: US 9,386,708 B2
(45) Date of Patent: Jul. 5, 2016

(54) METHOD OF FORMING ELECTRIC WIRING USING INKJET PRINTING

(71) Applicant: Samsung Electronics Co., Ltd., Suwon-Si, Gyeonggi-Do (KR)

(72) Inventors: Joong-hyuk Kim, Seoul (KR); Yong-wan Jin, Seoul (KR); Young-ki Hong, Anyang-si (KR); Sung-gyu Kang, Suwon-si (KR); Seung-ho Lee, Suwon-si (KR); Jin-seok Hong, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 13/861,754

(22) Filed: Apr. 12, 2013

(65) Prior Publication Data

US 2014/0141156 A1  May 22, 2014

(30) Foreign Application Priority Data

Nov. 22, 2012 (KR) .................. 10-2012-0133149

(51) Int. Cl.
  *H05K 3/10* (2006.01)
  *H05K 3/12* (2006.01)
  (Continued)

(52) U.S. Cl.
  CPC ............ *H05K 3/1258* (2013.01); *C23C 22/78* (2013.01); *C23C 22/83* (2013.01); *H05K 3/125* (2013.01); *H05K 3/1208* (2013.01); *H05K 2201/09036* (2013.01)

(58) Field of Classification Search
  CPC ............ B41N 1/003; H05K 2203/013; H05K 2201/0257; H05K 3/4664; H05K 1/097; H05K 1/092; H05K 3/125; H05K 3/1241; H05K 3/381; C04B 41/009; C23C 22/83; C23C 22/78
  USPC ............... 427/98.4, 96.1, 97.3, 466
  See application file for complete search history.

(56) References Cited

U.S. PATENT DOCUMENTS 6,726,312 B1 *  4/2004  Fujimura et al. ............... 347/68
6,821,716 B2   11/2004  Karasawa et al.
(Continued)

FOREIGN PATENT DOCUMENTS

EP   0887667 A2 * 12/1998
JP   08188663 A  *  7/1996
(Continued)

OTHER PUBLICATIONS

Planarization Process for Transparent Polyimide Coatings to Reduce Topography and Overburden Variation, Wu-Sheng Shih, Jiro Yota, Hoa Ly, Ketan Itchhaporia, and Alex Smith, CS MANTECH Conference, May 14-17, 2007 195-198.*

*Primary Examiner* — David Turocy
*Assistant Examiner* — Mohammad Mayy
(74) *Attorney, Agent, or Firm* — Harness, Dickey & Pierce, P.L.C.

(57) ABSTRACT

Disclosed is a method of forming an electric wiring using inkjet printing. The method includes forming a main trench and first and second guide trenches on a substrate. The first and second guide trenches are disposed at opposite sides of the main trench. The method includes ejecting ink into the main trench, the ink including a conductive material. The method also includes heating the substrate to sinter the ink such that the electric wiring is formed an upper portion of the main trench, and contract the ink such that a tunnel is formed in a lower portion of the main trench.

11 Claims, 4 Drawing Sheets

(51) Int. Cl.
    *C23C 22/83* (2006.01)
    *C23C 22/78* (2006.01)

(56) References Cited

U.S. PATENT DOCUMENTS

| | | | |
|---|---|---|---|
| 7,348,618 B2 | 3/2008 | Woo et al. | |
| 7,566,656 B2 | 7/2009 | Liu et al. | |
| 7,569,465 B2 | 8/2009 | Chen et al. | |
| 7,838,103 B2 | 11/2010 | Niiya | |
| 7,875,404 B2 | 1/2011 | Moore et al. | |
| 8,008,105 B2* | 8/2011 | Huang | 438/52 |
| 2001/0025457 A1* | 10/2001 | Tselesin | 51/293 |
| 2001/0038889 A1* | 11/2001 | Pangrle et al. | 427/551 |
| 2002/0072014 A1* | 6/2002 | Schiltz | 430/312 |
| 2002/0110651 A1* | 8/2002 | Suzushi | 428/1.5 |
| 2003/0000891 A1* | 1/2003 | Gill | 210/500.25 |
| 2003/0022475 A1* | 1/2003 | Vieux-Rochaz et al. | 438/598 |
| 2003/0059984 A1* | 3/2003 | Sirringhaus et al. | 438/141 |
| 2003/0153233 A1* | 8/2003 | Amano | 445/24 |
| 2004/0161608 A1* | 8/2004 | Choi et al. | 428/404 |
| 2005/0170076 A1* | 8/2005 | Seki et al. | 427/66 |
| 2005/0259139 A1 | 11/2005 | Niiya | |
| 2006/0008942 A1* | 1/2006 | Romano et al. | 438/99 |
| 2006/0159838 A1* | 7/2006 | Kowalski et al. | 427/58 |
| 2007/0217167 A1* | 9/2007 | Murai et al. | 361/748 |
| 2007/0254161 A1* | 11/2007 | Wirth et al. | 428/426 |
| 2008/0038532 A1* | 2/2008 | Yi et al. | 428/220 |
| 2008/0167173 A1* | 7/2008 | Lima et al. | 501/80 |
| 2008/0318005 A1* | 12/2008 | Millward | 428/172 |
| 2009/0011141 A1* | 1/2009 | Carter et al. | 427/534 |
| 2009/0061213 A1* | 3/2009 | Bahnmuller et al. | 428/332 |
| 2009/0147232 A1* | 6/2009 | Van Haren et al. | 355/67 |
| 2009/0181218 A1* | 7/2009 | Park et al. | 428/195.1 |
| 2010/0092892 A1* | 4/2010 | Kurita et al. | 430/321 |
| 2012/0115283 A1* | 5/2012 | Maekawa | H05K 3/1208 438/151 |
| 2012/0183702 A1* | 7/2012 | Pique et al. | 427/554 |
| 2012/0225216 A1* | 9/2012 | Wu | 427/555 |
| 2013/0164932 A1* | 6/2013 | Lee et al. | 438/652 |

FOREIGN PATENT DOCUMENTS

| | | |
|---|---|---|
| JP | 2006078860 A | 3/2006 |
| KR | 20080001381 A | 1/2008 |
| KR | 20090100186 A | 9/2009 |
| KR | 20100072559 A | 7/2010 |

* cited by examiner

METHOD OF FORMING ELECTRIC WIRING USING INKJET PRINTING

CROSS-REFERENCE TO RELATED APPLICATIONS

This application claims the benefit of Korean Patent Application No. 10-2012-0133149, filed on Nov. 22, 2012, in the Korean Intellectual Property Office, the disclosure of which is incorporated herein in its entirety by reference.

BACKGROUND

1. Field

At least one example embodiment relates to methods for forming an electric wiring, and more particularly, to methods of forming an electric wiring using inkjet printing.

2. Description of Related Art

In general, an inkjet printing apparatus is an apparatus for printing a predetermined image by ejecting micro-droplets of ink to a desired location on a printing medium through a nozzle of an inkjet head. In recent years, methods of forming electric wiring having a fine line width of about 1-50 μm by ejecting functional ink using inkjet printing apparatus have been studied. Electric wiring having fine line widths have been applied to a flat panel display field such as liquid crystal displays (LCDs), Organic Light Emitting Devices (OLEDs), etc., a flexible display field such as electronic paper (e-paper), etc., and an Organic Thin Film Transistor (OTFT) field, in addition to a simple electric circuit.

SUMMARY

At least one example embodiment provides methods of forming electric wiring using inkjet printing.

Additional aspects will be set forth in part in the description which follows and, in part, will be apparent from the description, or may be learned by practice of the example embodiments.

According to at least one example embodiment, a method of forming an electric wiring includes forming a main trench and first and second guide trenches on a substrate. The first and second guide trenches are disposed at opposite sides of the main trench. The method includes ejecting ink into the main trench, the ink including a conductive material. The method also includes heating the substrate to, sinter the ink such that the electric wiring is formed an upper portion of the main trench, and contract the ink such that a tunnel is formed in a lower portion of the main trench.

According to at least one example embodiment, the ejecting the ink includes ejecting ink so as to contact an upper surface of a first trench wall between the main trench and the first guide trench and an upper surface of a second wall between the main trench and the second guide trench.

According to at least one example embodiment, the forming the main trench and the forming the first and second guide trenches includes forming each trench such that a sum of a width of an upper surface of the first trench wall and a width of an upper surface of the second trench wall is greater than a width of a bottom surface of the main trench.

According to at least one example embodiment, the ejecting the ink includes ejecting a solvent of the ink at a contact angle of greater than about 30 degrees with respect to the surface of the substrate.

According to at least one example embodiment, wherein the ink has a sintering temperature ranging from about 100° C. to about 500° C.

According to at least one example embodiment, the method further includes performing an ink-phobic surface treatment with respect to a surface of the substrate after forming the main trench and the first and second guide trenches.

According to at least one example embodiment, the performing the ink-phobic surface treatment includes coating fluorine on the surface of the substrate.

According to at least one example embodiment, the method further includes planarizing an upper surface of the electric wiring after the forming of the electric wiring.

According to at least one example embodiment, the forming the main trench and the forming the first and second guide trenches includes patterning the substrate via dry etching using a photolithography method.

According to at least one example embodiment, the ejecting the ink is for an inkjet printing method.

According to at least one example embodiment, the ink comprises one of a polar and a non-polar solvent.

According to at least one example embodiment, the conductive material comprises metal nanoparticles.

According to at least one example embodiment, the substrate comprises at least one of glass and silicon.

BRIEF DESCRIPTION OF THE DRAWINGS

These and/or other aspects will become apparent and more readily appreciated from the following description of example embodiments, taken in conjunction with the accompanying drawings of which.

DETAILED DESCRIPTION OF EXAMPLE EMBODIMENTS

Figure 1:
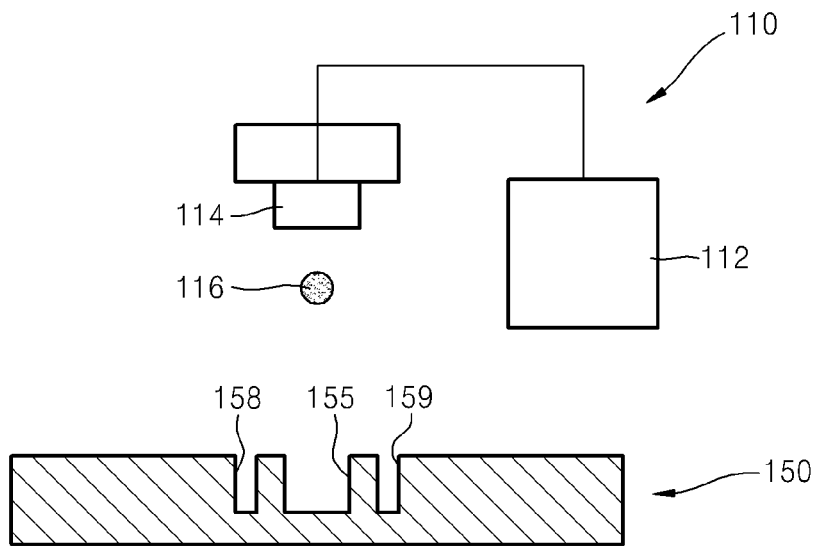
FIG. 1 illustrates an operation of printing ink on a substrate using an inkjet printing apparatus according to an exemplary embodiment.

Example embodiments will be understood more readily by reference to the following detailed description and the accompanying drawings. The example embodiments may, however, be embodied in many different forms and should not be construed as being limited to those set forth herein. Rather, these example embodiments are provided so that this disclosure will be thorough and complete. In at least some example embodiments, well-known device structures and well-known technologies will not be specifically described in order to avoid ambiguous interpretation.

It will be understood that when an element is referred to as being "connected to" or "coupled to" another element, it can be directly on, connected or coupled to the other element or intervening elements may be present. In contrast, when an element is referred to as being "directly connected to" or "directly coupled to" another element, there are no intervening elements present. Like numbers refer to like elements throughout. As used herein, the term "and/or" includes any and all combinations of one or more of the associated listed items.

It will be understood that, although the terms first, second, third, etc., may be used herein to describe various elements, components and/or sections, these elements, components and/or sections should not be limited by these terms. These terms are only used to distinguish one element, component or section from another element, component or section. Thus, a first element, component or section discussed below could be termed a second element, component or section without departing from the teachings of the example embodiments.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises," "comprising," "includes," and/or "including" when used in this specification, specify the presence of stated components, steps, operations, and/or elements, but do not preclude the presence or addition of one or more other components, steps, operations, elements, and/or groups thereof.

Unless otherwise defined, all terms (including technical and scientific terms) used herein have the same meaning as commonly understood by one of ordinary skill in the art to which these example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Spatially relative terms, such as "below", "beneath", "lower", "above", "upper", and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description.

FIG. 1 illustrates an operation of printing ink on a substrate using an inkjet printing apparatus according to an exemplary embodiment.

Referring to FIG. 1, the inkjet printing apparatus 110 is movably installed on a substrate 150 where a printing operation is to be performed. The inkjet printing apparatus 110 includes an inkjet head ejecting ink droplets 116, and an ink chamber 112 supplying ink to the inkjet head 114. A main trench 155 for forming of a tunnel and an electric wiring, which will be described later, is formed on the substrate 150. First and second guide trenches 158 and 159 are formed side-by-side with the main trench 155 at both sides of the main trench 155. The inkjet printing apparatus 110 performs a printing operation by ejecting the ink droplets 116 into the main trench 155 from the inkjet head 114 while moving along the main trench 155 formed on the substrate 150. The ink used in the printing operation forms an electric wiring, and thus, may include a conductive material. Hereinafter, a method of forming an electric wiring using the above-mentioned inkjet printing apparatus 110 will be described in more detail.

FIGS. 2 through 8 illustrate a method of forming an electric wiring using inkjet printing according to an exemplary embodiment.

Figure 2:
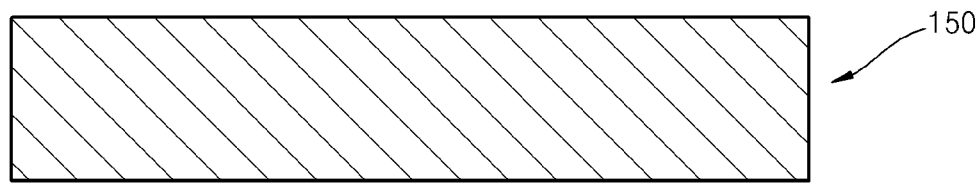
FIGS. 2 through 8 illustrate a method of forming an electric wiring using inkjet printing according to an exemplary embodiment.
Figure 3:
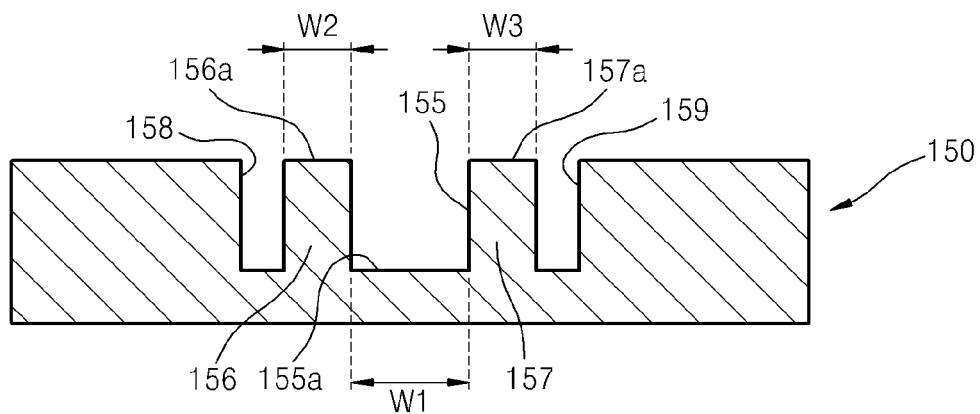
Figure 4:
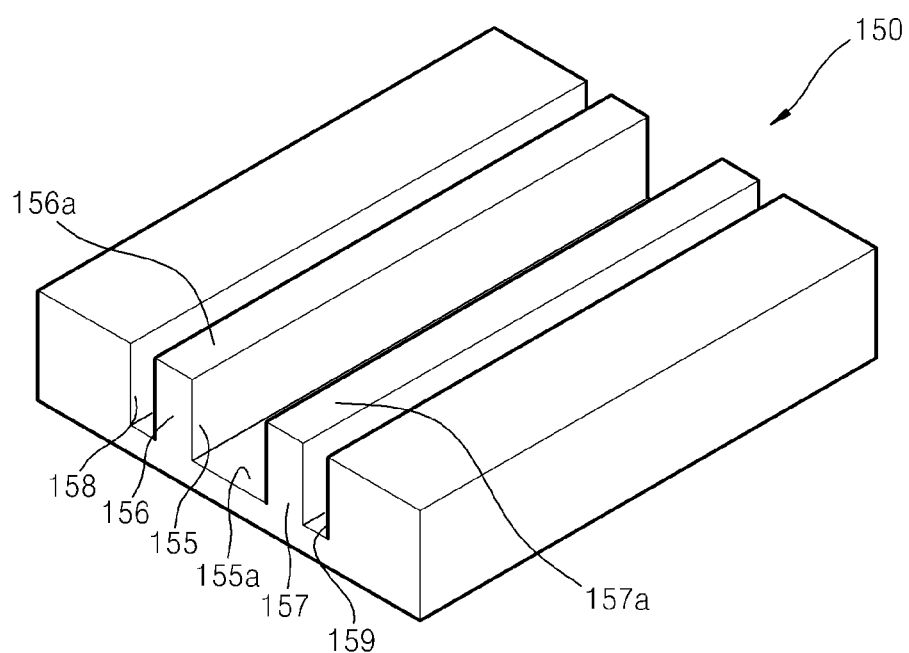

Referring to FIG. 2, a substrate 150 is prepared. The substrate 150 may have a hydrophilic or hydrophobic surface. For example, a glass substrate or a silicon substrate may be used as the substrate 150, however, example embodiments are not limited thereto. Substrate 150 may be formed from any material suitable for inkjet printing. Referring to FIG. 3, a main trench 155 and first and second guide trenches 158 and 159 are formed on the substrate 150. As will be described later, the main trench 155 forms a tunnel (see 180 of FIG. 7) and an electric wiring (see 171 of FIG. 7) and the first and second guide trenches 158 and 159 serve to maintain a constant line width of the electric wiring 171. FIG. 4 is a perspective view of the substrate 150 illustrated in FIGS. 1-3. Although FIG. 4 illustrates that the main trench 155 is formed in a straight line shape, example embodiments are not limited thereto. For example, the main trench 155 may be formed in various other shapes in accordance with a desired electric wiring pattern.

The first and second guide trenches 158 and 159 may be formed side-by-side with the main trench 155 at both sides of the main trench 155. A first trench wall 156 may be between the main trench 155 and the first guide trench 158, and a second trench wall 157 may be between the main trench 155 and the second guide trench 159. The main trench 155 and the first and second guide trenches 158 and 159 may be formed by patterning the substrate 150 via dry etching using a photolithography method. Specifically, a photoresist film (not shown) is coated on the substrate 150 and then exposed to light and developed in a desired (or alternatively, predetermined) pattern. Thereafter, the substrate 150 may be dry-etched by using the developed photoresist pattern as an etch mask to form the main trench 155 and the first and second guide trenches 158 and 159 on the substrate 150. Although not illustrated in the drawings, the main trench 155 and the first and second guide trenches 158 and 159 may be formed by coating a desired (or alternatively, predetermined) material layer on a substrate and patterning the desired (or alternatively, predetermined) material layer via dry etching using a photolithography method.

Although the first trench wall 156 and the second trench wall 157 may be formed with the same width, example embodiments are not limited thereto. For example, the first trench wall 156 and the second trench wall 157 may be formed to have different widths. In at least one example embodiment, a sum of a width W2 of an upper surface 156a of the first trench wall 156 and a width W3 of an upper surface 157a of the second trench wall 157 may be greater than a width W1 of a bottom surface 155a of the main trench 155. As a result, a coupling force between the ink (see 170 of FIG. 5) and the upper surfaces 156a and 157a is greater than a coupling force between the ink 170 and the bottom surface 155a of the main trench 155. A depth of the main trench 155 may vary accordingly to the amount of the ink 170 filled in the main trench 155 and/or the amount of the conductive material contained in the ink 170.

After the main trench 155 and the first and second guide trenches 158 and 159 are formed on the substrate 150, the surface of the substrate 150 may be subject to an ink-phobic treatment. This is to increase the contact angle of the ink 170 with respect to the surface of the substrate 150. For example, in the case where the ink 170 includes a polar solvent, the surface of the substrate 150 may be hydrophobic-treated. In another example, where the ink 170 includes a non-polar solvent, the surface of the substrate 150 may be hydrophilictreated. For example, the ink-phobic surface treatment may be performed by coating fluorine on the surface of the substrate 150.

Figure 5:
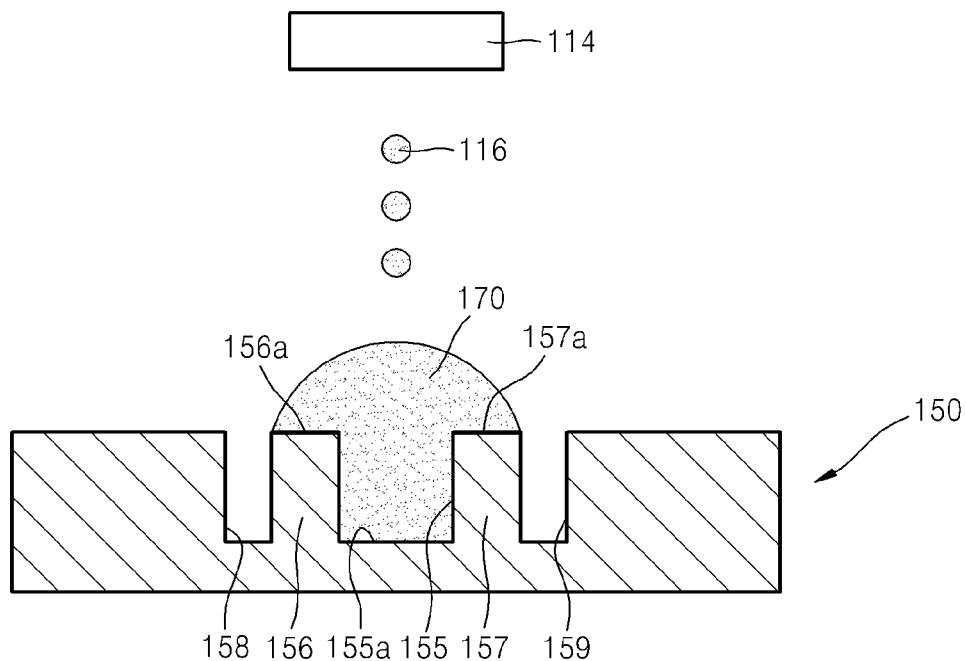

Referring to FIG. 5, ink 170 is filled in the main trench 155 by ejecting ink droplets 116 from the inkjet head 114 of the inkjet printing apparatus (see 110 of FIG. 1). The ink 170 may include a conductive material. For example, the ink 170 may include metal nanoparticles. The metal nanoparticle may include, for example, Ag, Au or Cu, however, example embodiments are not limited thereto. For example, the metal nanoparticles may include other materials suitable for forming electric wiring. The ink 170 may include a polar or a non-polar solvent. For example, in the case where the substrate 150 has a hydrophobic surface, the ink 170 may include a polar solvent, such as water in order to increase the contact angle with respect to the surface of the substrate 150. In this case, the ink 170 may be a solution in which conductive materials, such as metal nanoparticles are dispersed in water. In another example, where the substrate 150 has a hydrophilic surface, the ink 170 may include a non-polar solvent, such as n-tetradecane in order to increase the contact angle with respect to the surface of the substrate 150.

The ink 170 may be printed so as to contact the upper surface 156a of the first trench wall 156 and the upper surface 157a of the second trench wall 157. Also, during the inkjet printing operation, the ink 170 may have a contact angle of not less than 30 degrees with respect to the surface of the substrate 150 in order to mitigate the possibility of (or alternatively, prevent) the ink 170 from moving to insides of the first and second guide trenches 158 and 159. However, example embodiments are not necessarily limited thereto. Without first and second guide trenches 158 and 159 on the substrate 150, bulging of the ink 170 may occur at the surface of the substrate 150 around the main trench 155, so that the electric wiring may be formed with a non-uniform line width.

Figure 6:
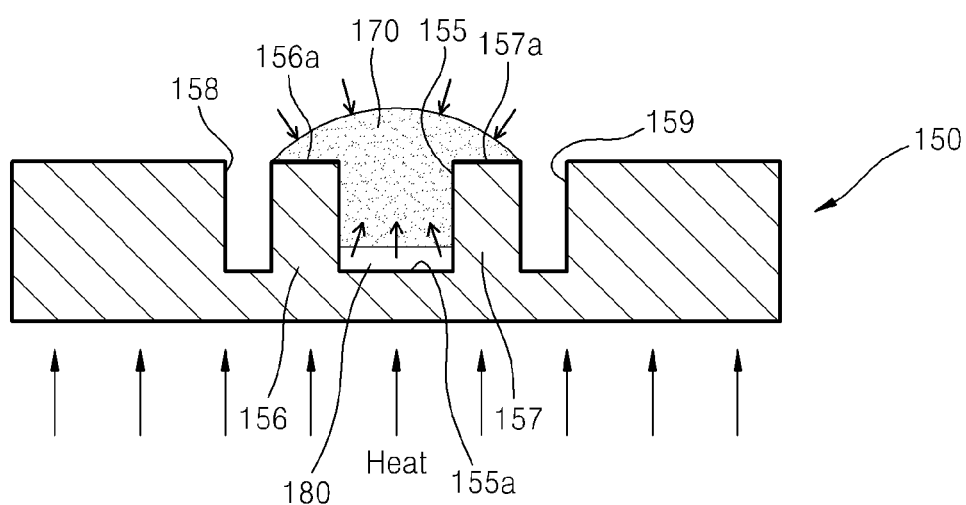
Figure 7:
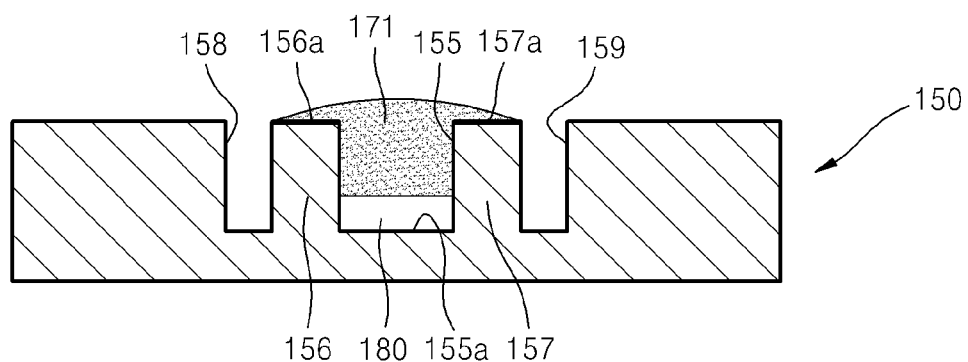

Referring to FIG. 6, the substrate 150 is heated to a desired (or alternatively predetermined) temperature to sinter the ink 170 filled in the main trench 155. The sintering temperature of the ink 170 may be in a range of about 100-500° C. However, example embodiments are not limited thereto. For example, the sintering temperature may be adjusted higher or lower according to a desired contraction of the ink 170. Through the sintering operation of the ink 170, as illustrated in FIG. 7, a tunnel 180 may be formed in a lower portion of the main trench 155 due to contraction of the ink 170, and the electric wiring 171 of a conductive material may be formed in an upper portion of the main trench 155.

Figure 8:
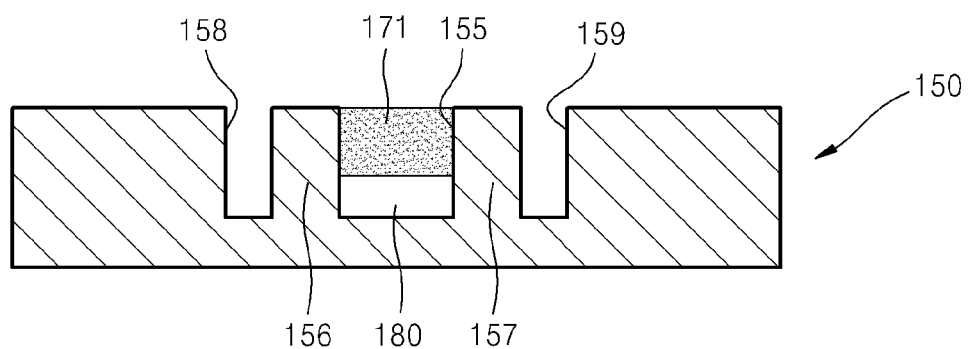

In the sintering operation of the ink 170, the ink 170 is contracted as solvents are evaporated. As described above, the sum of the width W2 of the upper surface 156a of the first trench wall 156 and the width W3 of the upper surface 157a of the second trench wall 157 may be greater than the width W1 of the bottom surface 155a of the main trench 155. Therefore, when the ink 170 is filled in the main trench 155 so as to contact the upper surface 156a of the first trench wall 156 and the upper surface 157a of the second trench wall 157, the coupling force between the ink 170 and the upper surfaces 156a and 157a of the first and second trench walls 156 and 157 becomes greater than the coupling force between the ink 170 and the bottom surface 155a of the main trench 155. Accordingly, the ink 170 filled in the lower portion of the main trench 155 moves up due to contraction of the ink 170 during the contraction operation of the ink 170, so that the tunnel 180 having a vacant space may be formed in the lower portion of the main trench 155. As the sintering of the ink 170 is further progressed, the conductive materials in the ink 170, for example, metal nanoparticles are agglomerated so that the electric wiring 171, from which pores are removed, is formed. As a result, the electric wiring 171 is formed in the upper portion of the main trench 155 and the tunnel 180 is formed standing in a line under the electric wiring 171. After the electric wiring 171 is formed in the upper portion of the main trench 155, a process of planarizing a protruded upper surface of the electric wiring 171 may be further performed as illustrated in FIG. 8.

As described above, the electric wiring structure including a tunnel inside the main trench 155 of the substrate 150 may be formed by using the coupling force between the ink 170 and the surface of the substrate 150. Also, by forming the guide trenches along both sides of the main trench 155 in the substrate 150, bulging of the ink 170 may be reduced (or alternatively, prevented) so that the electric wiring 171 may be formed with a uniform line width. The electric wiring structure including such a tunnel may be diversely applied to a memory field including an interlayer insulation layer, a device isolation layer, a high dielectric layer, or the like, or a chemical gas sensor field, or the like.

It should be understood that the exemplary embodiments described therein should be considered in a descriptive sense only and not for purposes of limitation. Descriptions of features or aspects within each embodiment should typically be considered as available for other similar features or aspects in other embodiments.

What is claimed is:

1. A method of forming an electric wiring, the method comprising:
    forming a main trench and first and second guide trenches on a substrate, the first and second guide trenches being disposed at opposite sides of the main trench;
    performing an ink-phobic surface treatment with respect to a surface of the substrate by coating fluorine on the surface of the substrate after forming the main trench and the first and second guide trenches;
    ejecting ink into the main trench to fill the main trench with the ink, the ink including a conductive material and a solvent; and
    sintering the ink filled in the main trench to form the electric wiring formed of the conductive material in an upper portion of the main trench and form a tunnel in a lower portion of the main trench,
    wherein the ejecting the ink includes ejecting ink so as to contact an upper surface of a first portion of the substrate between the main trench and the first guide trench and to contact an upper surface of a second portion of the substrate between the main trench and the second guide trench, and
    wherein the forming the main trench and the forming the first and second guide trenches includes forming each trench such that a sum of a width of the upper surface of the first portion of the substrate and a width of the upper surface of the second portion of the substrate is greater than a width of a bottom surface of the main trench, and
    wherein during the sintering of the ink, the ink filled in the lower portion of the main trench moves up by contraction of the ink due to evaporation of the solvent so that the ink substantially separates from the bottom surface of the main trench and the tunnel is formed in the lower portion of the main trench.

2. The method of claim 1, wherein the ejecting the ink includes ejecting the solvent of the ink at a contact angle of greater than about 30 degrees with respect to the surface of the substrate.

3. The method of claim 1, wherein the ink has a sintering temperature ranging from about 100° C. to about 500° C.

4. The method of claim 1, further comprising:
planarizing an upper surface of the electric wiring after the forming of the electric wiring.

5. The method of claim 1, wherein the forming the main trench and the forming the first and second guide trenches includes patterning the substrate via dry etching using a photolithography method.

6. The method of claim 1, wherein the ejecting the ink is for an inkjet printing method.

7. The method of claim 1, wherein the solvent comprises one of a polar and a non-polar solvent.

8. The method of claim 1, wherein the conductive material comprises metal nanoparticles.

9. The method of claim 1, wherein the substrate comprises at least one of glass and silicon.

10. The method of claim 1, wherein the ejecting the ink ejects the ink such that a coupling force between the ink and the upper surfaces of the first and second portions of the substrate is greater a coupling force between the ink and the bottom surface of the main trench.

11. The method of claim 1, wherein the electric wiring in the upper portion of the main trench represents a larger portion of the main trench than the tunnel in the lower portion of the main trench.

* * * * *